United States Patent
Hsu et al.

(10) Patent No.: US 8,286,119 B2
(45) Date of Patent: Oct. 9, 2012

(54) SYSTEMATIC METHOD FOR VARIABLE LAYOUT SHRINK

(75) Inventors: Fu-Chieh Hsu, Hsin-Chu (TW); Louis Chao-Chiuan Liu, Hsin-Chu (TW); Lee-Chung Lu, Taipei (TW); Yi-Kan Cheng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 380 days.

(21) Appl. No.: 12/617,046

(22) Filed: Nov. 12, 2009

(65) Prior Publication Data

US 2010/0199238 A1    Aug. 5, 2010

Related U.S. Application Data

(60) Provisional application No. 61/148,822, filed on Jan. 30, 2009.

(51) Int. Cl.
    *G06F 17/50*    (2006.01)

(52) U.S. Cl. .......................................... 716/132

(58) Field of Classification Search .................. 716/132, 716/133, 134, 135
    See application file for complete search history.

(56) References Cited

U.S. PATENT DOCUMENTS

| 5,640,497 | A | * | 6/1997 | Woolbright | ..................... 716/55 |
| 2007/0276770 | A1 | * | 11/2007 | Fu et al. | ....................... 705/400 |

\* cited by examiner

*Primary Examiner* — Vuthe Siek
(74) *Attorney, Agent, or Firm* — Slater & Matsil, L.L.P.

(57) ABSTRACT

A method for integrated circuit design includes providing a layout of an integrated circuit; determining key parameters of the integrated circuit; determining target values of the key parameters; and performing a first shrinkage of the layout using a first shrink percentage to generate a shrunk layout. The shrunk layout is evaluated by generating values of the key parameters from the shrunk layout. A portion of the values of the key parameters failing to meet respective ones of the target values is found. Guidelines for tuning manufacturing processes of the shrunk layout are provided, so that the portion of the values of the key parameters can meet the respective ones of the target values.

22 Claims, 1 Drawing Sheet

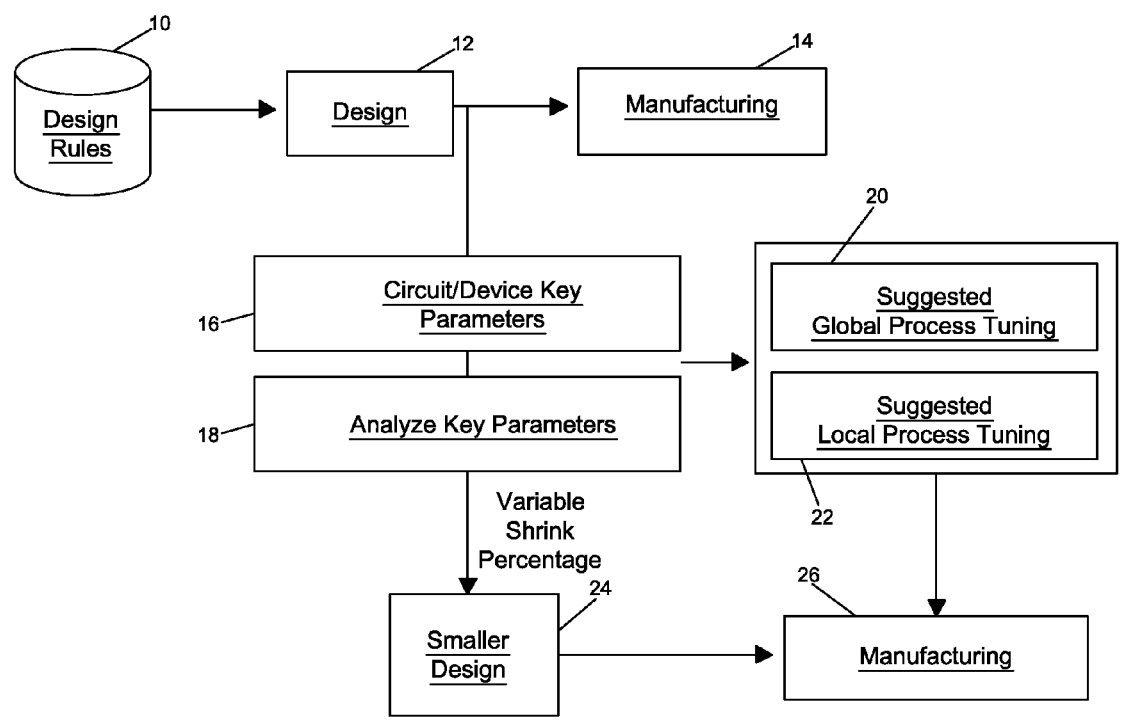

SYSTEMATIC METHOD FOR VARIABLE LAYOUT SHRINK

This application claims the benefit of U.S. Provisional Application No. 61/148,822 filed on Jan. 30, 2009, entitled "Systematic Method for Variable Layout Shrink," which application is hereby incorporated herein by reference.

TECHNICAL FIELD

This invention relates generally to integrated circuits, and more particularly to methods for shrinking layouts of the integrated circuits.

BACKGROUND

In order to incorporate more functions and to achieve better performance and less cost, integrated circuits are formed with increasingly smaller dimensions. In order to achieve smaller dimensions, circuits may be re-designed according to the design rules of the reduced scale. Accordingly, it can be ensured that not only the design with the smaller scale can be manufactured, but it can also be ensured that the circuit with the smaller scale can meet the design specifications.

It is, however, not cost effective to re-design the circuits for smaller dimensions. Since there are legacy circuits that have already been laid out with greater dimensions (scale), a cost-effective method has been explored to shrink the layouts of the legacy circuits, in which all the masks used for manufacturing the integrated circuits are shrunk by a same percentage. It is relatively easy to verify whether the shrunk circuits can be manufactured or not, for example, whether two neighboring features in the integrated circuits will be shorted or not if the integrated circuits are manufactured with the smaller scale. However, it is questionable whether the circuits, after they are shrunk, will be able to meet design specifications, for example, the timing requirement, the drive current requirement, or the like.

Conventionally, for shrinking a circuit, a target shrinking percentage is pre-determined, and then the feasibility of the shrinkage is determined. The feasibility includes whether the shrunk circuits can be manufactured or not, and whether the shrunk circuits can meet design specifications or not. If it is determined that the shrunk circuits cannot meet design specifications, foundries have to send the circuits back to clients for re-design, which, as aforementioned, will result in increased design cost. What is needed, therefore, is a method for overcoming the above-described shortcomings in the prior art.

SUMMARY OF THE INVENTION

In accordance with one aspect of the present invention, a method for integrated circuit design includes providing a layout of an integrated circuit; determining key parameters of the integrated circuit; determining target values of the key parameters; and performing a first shrinkage of the layout using a first shrink percentage to generate a shrunk layout. The shrunk layout is evaluated by generating values of the key parameters from the shrunk layout. A portion of the values failing to meet respective ones of the target values are found. Guidelines for tuning manufacturing processes of the shrunk layout are provided, so that the portion of the key parameters can meet the respective ones of the target values.

In accordance with another aspect of the present invention, a method for integrated circuit design includes providing a layout of an integrated circuit; determining key parameters of the integrated circuit; determining design specifications of the key parameters; performing a shrinkage to the layout using a shrink percentage to generate a shrunk layout; evaluating the shrunk layout by generating values of the key parameters from the shrunk layout; and determining a maximum shrink percentage of the integrated circuit.

In accordance with yet another aspect of the present invention, a method for integrated circuit design includes providing a layout of an integrated circuit; determining key parameters of the integrated circuit; determining design specifications of the key parameters; and determining a plurality of candidate shrink percentages different from each other. For each of the plurality of candidate shrink percentages, a plurality of steps is performed, wherein the steps include performing a shrinkage of the layout using each of the plurality of candidate shrink percentages to generate a shrunk layout; evaluating the shrunk layout by generating values of the key parameters from the shrunk layout; finding a portion of the key parameters failing to meet respective ones of the design specifications; and determining guidelines for tuning manufacturing processes of the shrunk layout, wherein the guidelines are selected from the group consisting essentially of a global tuning and a local tuning.

The advantageous features of the present invention include reduced design cost. Further, fine-tuned maximum shrink percentage can be achieved without affecting the performance of the integrated circuits.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 illustrates a flow chart of an embodiment.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1 illustrates an exemplary flow chart of an embodiment. In a design process, for a specific integrated circuit manufacturing technology, for example, 45 nm technology, a set of design rules is provided (block 10). Integrated circuits are then designed (block 12) according to the design rules, wherein the corresponding integrated circuit design includes a layout (referred to as an original layout hereinafter) of the integrated circuits. The integrated circuits can then be manufactured (block 14).

If the integrated circuits need to be manufactured using a technology having a smaller scale than the original technology the integrated circuits are designed for, a shrink process may be performed to shrink the layouts of the integrated circuits. Accordingly, the embodiments of the present invention provide a process not only to determine whether the shrunk layouts can meet design specifications (target values) or not after a shrinking is performed, but also can provide manufacturing guidelines as to how the design specifications can be achieved, as will be discussed in detail in subsequent paragraphs.

In an embodiment of the present invention, a list of candidate shrink percentages is determined. For example, the candidate shrink percentages may include 3 percent, 5 percent, 8 percent, 10 percent, and 12 percent. Accordingly, the shrink percentages of the embodiments are referred to as variable shrink percentages, as compared to the otherwise single shrink percentage. The candidate shrink percentages may be determined based on the available integrated circuit manufacturing technologies, the scale the integrated circuits are originally designed for, and experiences in past manufacturing design and manufacturing processes. A key parameter list of the integrated circuits is then determined (block 16 in FIG. 1). The key parameter list includes a plurality of key parameters that may be used to evaluate the functionality and the performance of the original layout and the shrunk layouts. As will be discussed in detail in subsequent paragraphs, if the values of the key parameters meet design specifications (or target values) in simulations of the shrunk layouts, it can be reasonably concluded that the integrated circuits manufactured using the respective shrunk layouts will also meet the design specifications. If, however, the simulations reveal that after the shrinking, there is at least one of the values in the key parameter list that cannot meet the design specifications, the original layout cannot be shrunk using the respective shrink percentage, unless further tuning in the manufacturing processes is made. In an exemplary embodiment, the key parameter list includes path timings, device on-currents, device off-currents, power supplies and reliability, voltage gains, Vcc_mins (the minimum power supply voltages for a memory device to perform read and write operations reliably), and the like, although other parameters that represent the behaviors of the integrated circuits can also be in the key parameter list.

In an embodiment, for each of the candidate shrink percentages, a shrinkage is performed to the original layout to generate shrunk layouts. An analysis (evaluation) is then performed to each of the shrunk layouts (block 18 in FIG. 1). For example, the shrunk layout generated with a 3-percent shrinkage is evaluated first. In the analysis, simulations may be performed to determine the values of the key parameters of the shrunk layouts. If all of the values in the key parameter list meet the design specifications, the original layout may be shrunk by 3 percent without the need for re-design or tuning in the manufacturing processes.

If, however, some of the values in the key parameter list cannot meet the design specifications, then the manufacturing processes of the shrunk layouts may be performed to adjust those values that failed to meet the design specifications. Since the simulations have revealed which of the key parameters cannot meet the design specifications, one or more suggested global process tunings of the integrated circuit manufacturing processes may be performed (block 20 in FIG. 1), which may be based on past experience. Throughout the description, the term "global" refers to the processes or parameters related to a majority of features on a chip or a wafer. For example, a thickness of a metal layer or a material of a dielectric layer may affect most of the devices throughout the chip or the wafer, and hence is global. The tuning of the thickness of the metal layer is thus a global (process) tuning Exemplary global tuning includes the tuning of the thicknesses of metal layers, the materials of the metal layers, the thicknesses of dielectric layers, the materials of the dielectric layers, and the like. In an exemplary embodiment, to reduce path timing, a thickness of a metal layer may be increased in order to reduce the sheet resistances of the metal lines in the metal layer. With the global tuning or the subsequently discussed local tuning, the respective shrunk layouts should meet the design specifications. Otherwise, the respective shrinking cannot be preformed.

In the simulations for determining the values of the key parameters, both the mean value and the spread of the simulated circuits need to be determined. For example, simulation results may reveal that a parameter has a mean value of 1. However, the parameter may have a worst value of 0.5 (at a first process corner) and a best value of 1.5 (at a second process corner) due to process variations. In an embodiment, not only the mean value needs to meet the design specifications, but the worst value also needs to meet the design specifications. Accordingly, the process corners need to be tightened, so that the spread (the difference between the worst value and the best value) is reduced. The tightening and shifting of the process corners may also be performed by the global process tuning.

The global process tuning may be performed using various methods. For example, as discussed in the preceding paragraphs, the global tuning may be performed by changing the thicknesses and the materials of metal layers and/or dielectric layers. Further, the global tuning may be performed by sizing up or sizing down interconnection features such as vias. The global tuning may also be performed by performing logic operations, for example, by changing the logic operations that are used to determine sizes of some features through the sizes of other features.

The values of the key parameters may also be adjusted through local process tuning (block 22 in FIG. 1). Throughout the description, the term "local" is used to refer to the processes or parameters related to only a local region of a wafer. In an exemplary embodiment, local process tuning includes adjusting local devices and interconnections including, but not limited to, adjusting gate lengths of MOS transistors, adjusting gate widths of MOS transistors, adjusting sizes of diffusion regions, adjusting contact-to-gate spacing, adjusting length-of-diffusion (LOD), adjusting poly-space effects (PSEs), adjusting OD-space effects (OSEs), and the like.

Local process tuning may also include tuning wire widths (or lengths) in metal or non-metal interconnects, tuning wire widths (or lengths) in metal-oxide-metal (MOM) capacitors to modulate capacitance values, replacing MOS capacitors with MOM capacitors to modulate capacitance values, replacing MOM capacitors with MOS capacitors to modulate capacitance values, tuning the sizes of non-silicide layers to modulate resistance values, and/or tuning the sizes of silicide layers to modulate resistance values.

It is realized that the analysis may indicate that there are more than one of the key parameters not meeting the design specifications, and each of the key parameters may require different global tunings and/or local tunings These tuning requirements may conflict with each other. For example, reducing the leakage currents of MOS transistors may require an increase in the gate lengths of MOS transistors, while increasing the drive currents may require a reduction in the gate lengths of the MOS transistors. Therefore, a trade-off may need to be made to ensure all of the key parameters meet the design specifications.

Situations may arise in which, after a shrinkage, most parts of the respective shrunk layout in a chip are expected to meet design specifications (with or without the global and/or local tuning) However, there may still be a very small portion of the shrunk layout (referred to as a non-shrinkable portion hereinafter) that cannot meet the design specifications, regardless of how tuning is performed. In an embodiment, a re-design is made, for example, to re-layout this portion of the integrated circuits. The re-designed layout meets the design specifications, and has the same footprint as the original portion. After the original layout is shrunk to generate the shrunk layout, the re-designed circuits may replace the non-shrinkable portion of the shrunk layout. Please note that all the shrinking and replacing may occur transparently to the client, and hence it appears to the client that the shrinking occurs seamlessly.

As discussed in the preceding paragraphs, there is a list of candidate shrink percentages. In an embodiment of the present invention, each, or two or more shrinkage percentages in the list, is evaluated using the above-discussed analysis method. It is likely that some of the small shrink percentages may be used in the shrinking without requiring any of the global process tuning or local process tuning, while greater shrink percentages may require the global process tuning and/or the local process tuning Further, it is expected that with the increase in the shrink percentages, more global process tuning and local process tuning may be needed. Eventually, there will be one or more shrink percentages that is too big, and regardless of how the global process tuning and the local process tuning are performed (with a reasonable effort and cost), there is still at least one of the values in the key parameter list not able to meet the design specifications. Accordingly, a maximum shrink percentage can be found from the candidate shrink percentage list, wherein the original layouts may be shrunk using the maximum shrink percentage, but cannot shrink using any shrink percentage in the list of the candidate shrink percentages greater than the maximum shrink percentage. Therefore, the embodiments of the present invention provide a variable shrink solution that provides a list of shrink percentages, below the maximum shrink percentage, that can be used, wherein the respective integrated circuits can not only be manufactured, but also will certainly meet design specifications.

After the maximum shrink percentage is found, a shrink percentage may be selected to perform the shrinkage on the original layout, resulting in a smaller layout (block 24 in FIG. 1). The smaller layouts may then be used for manufacturing on wafers (block 26 in FIG. 1). With the maximum shrink percentage known, the design may be shrunk to the maximum possible value.

The embodiments of the present invention, due to its systematic feature, can be automated. For the shrinking of each taped-out design, such a method can be applied with as little manual intervention as possible.

An advantageous feature of the embodiments is that a maximum shrink percentage can be provided by a foundry to a client, wherein the integrated circuits provided by the client can be shrunk up to the maximum shrink percentage. The process of performing the shrink, however, is transparent to the client. Further, the embodiments of the present invention not only provide evaluation for a list of shrink percentages, but also provide guidelines as to how manufacturing processes can be tuned to achieve the shrinkages. As a comparison, in conventional shrink processes, if a shrink percentage requested by the client is not achievable, the client needs to re-design the integrated circuits. However, with the embodiments of the present invention, since the client now knows the maximum shrink percentage, a fine-tuning of the shrink percentage may be done to avoid the re-design work.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method for integrated circuit design, the method comprising:
providing a layout of an integrated circuit;
determining key parameters of the integrated circuit;
determining target values of the key parameters;
performing a first shrinkage of the layout using a first shrink percentage to generate a shrunk layout;
evaluating the shrunk layout by generating values of the key parameters from the shrunk layout, wherein the values of the key parameters are generated using a computer;
determining a first portion of the values of the key parameters failing to meet respective ones of the target values; and
providing guidelines for tuning manufacturing processes of the shrunk layout, so that the first portion of the values of the key parameters meets the respective ones of the target values.

2. The method of claim 1 further comprising determining a maximum shrink percentage.

3. The method of claim 1 further comprising:
determining a plurality of candidate shrink percentages comprising the first shrink percentage; and
for each of the plurality of candidate shrink percentages, repeating steps of:
performing a shrinkage of the layout using the each of the plurality of candidate shrink percentages to generate an additional shrunk layout;
evaluating the additional shrunk layout by generating additional values of the key parameters from the additional shrunk layout;
determining a second portion of the additional values of the key parameters failing to meet additional respective ones of the target values; and
providing guidelines for tuning the manufacturing processes of the additional shrunk layout, wherein the guidelines are selected from the group consisting essentially of a global tuning and a local tuning.

4. The method of claim 1, wherein the guidelines for tuning the manufacturing processes of the shrunk layout comprise tightening process corners of the manufacturing processes.

5. The method of claim 1, wherein the key parameters are selected from the group consisting essentially of a path timing, a device on-current, a device off-current, a power supply and reliability, a voltage gain, a Vcc_min, and combinations thereof.

6. The method of claim 1, wherein the guidelines for tuning the manufacturing processes of the shrunk layout comprise guidelines of a global tuning.

7. The method of claim 6, wherein the global tuning comprises tuning a parameter selected from the group consisting essentially of a thickness of a metal layer, a material of a metal layer, a thickness of a dielectric layer, a material of a dielectric layer, and combinations thereof.

8. The method of claim 1, wherein the guidelines for tuning the manufacturing processes of the shrunk layout comprise guidelines of a local tuning.

9. The method of claim 8, wherein the local tuning comprises tuning a parameter selected from the group consisting essentially of a gate length, a gate width, a size of a diffusion region, a contact-to-gate spacing, a length-of-diffusion (LOD), a poly-space effect (PSE), an OD-space effect (OSE), a width of an interconnect, a length of an interconnect, a metal width in a metal-oxide-metal (MOM) capacitor, and combinations thereof.

10. The method of claim 8, wherein the local tuning comprises a step selected from the group consisting essentially of replacing a MOS capacitor with a MOM capacitor, replacing a MOM capacitor with a MOS capacitor, tuning a size of a silicide layer, tuning a size of a non-silicide layer, and combinations thereof.

11. The method of claim 1 further comprising replacing a portion of the shrunk layout with a re-designed layout, wherein the portion of the shrunk layout fails to meet the target values, and wherein the re-designed layout meets the target values.

12. A method for integrated circuit design, the method comprising:
providing a layout of an integrated circuit;
determining key parameters of the integrated circuit;
determining design specifications of the key parameters;
performing a first shrinkage to the layout using a first shrink percentage to generate a first shrunk layout;
evaluating the first shrunk layout by generating first values of the key parameters from the first shrunk layout;
performing a second shrinkage to the layout using a second shrink percentage greater than the first shrink percentage to generate a second shrunk layout;
evaluating the second shrunk layout by generating second values of the key parameters from the second shrunk layout, wherein the second values of the key parameters are generated using a computer;
finding a portion of the second values failing to meet respective ones of the design specifications; and
determining guidelines for tuning manufacturing processes of the second shrunk layout, so that all of the key parameters meet the design specifications.

13. The method of claim 12 further comprising determining a maximum shrink percentage of the integrated circuit as being a shrink percentage smaller than the second shrink percentage.

14. The method of claim 12, wherein the guidelines for tuning the manufacturing processes of the second shrunk layout comprise tightening process corners of the manufacturing processes.

15. The method of claim 12, wherein the guidelines for tuning the manufacturing processes of the second shrunk layout comprise guidelines of a global tuning.

16. The method of claim 15, wherein the global tuning comprises tuning a parameter selected from the group consisting essentially of a thickness of a metal layer, a material of a metal layer, a thickness of a dielectric layer, a material of a dielectric layer, and combinations thereof.

17. The method of claim 12, wherein the guidelines for tuning the manufacturing processes of the second shrunk layout comprise guidelines of a local tuning.

18. The method of claim 17, wherein the local tuning comprises tuning a parameter selected from the group consisting essentially of a gate length, a gate width, a size of a diffusion region, a contact-to-gate spacing, a length-of-diffusion (LOD), a poly-space effect (PSE), an OD-space effect (OSE), and combinations thereof.

19. The method of claim 12 further comprising, after the step of performing the first shrinkage, replacing a portion of the first shrunk layout with a re-designed layout.

20. The method of claim 12, wherein the key parameters are selected from the group consisting essentially of a path timing, a device on-current, a device off-current, a power supply and reliability, a voltage gain, a Vcc_min, and combinations thereof.

21. A method for integrated circuit design, the method comprising:
providing a layout of an integrated circuit;
determining key parameters of the integrated circuit;
determining design specifications of the key parameters;
determining a plurality of candidate shrink percentages different from each other; and
for each of the plurality of candidate shrink percentages, repeating steps of:
performing a shrinkage of the layout using the each of the plurality of candidate shrink percentages to generate a shrunk layout;
evaluating the shrunk layout by generating values of the key parameters from the shrunk layout, wherein the values of the key parameters are generated using a computer;
finding a portion of the key parameters failing to meet respective ones of the design specifications; and
determining guidelines for tuning manufacturing processes of the shrunk layout, wherein the guidelines are selected from the group consisting essentially of a global tuning and a local tuning.

22. The method of claim 21 further comprising finding a maximum shrink percentage in the plurality of candidate shrink percentages.

* * * * *